(12) United States Patent
Ma et al.

(10) Patent No.: US 6,827,585 B2
(45) Date of Patent: Dec. 7, 2004

(54) ELECTRICAL CONNECTOR WITH DUAL-FUNCTION SIDEWALLS

(75) Inventors: Hao-Yuan Ma, Tu-Chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/769,272

(22) Filed: Jan. 30, 2004

(65) Prior Publication Data

US 2004/0185689 A1 Sep. 23, 2004

Related U.S. Application Data

(63) Continuation of application No. 10/318,593, filed on Dec. 13, 2002, now Pat. No. 6,695,625.

(30) Foreign Application Priority Data

Oct. 18, 2002 (TW) ........................................ 91216625 U

(51) Int. Cl.[7] .............................................. H01R 12/00
(52) U.S. Cl. ......................... 439/70; 439/342; 439/525; 439/885; 439/330
(58) Field of Search ..................... 439/70–72, 525–527, 439/330, 342, 885

(56) References Cited

U.S. PATENT DOCUMENTS

| | | | | |
|---|---|---|---|---|
| 3,951,495 A | * | 4/1976 | Donaher et al. | ............ 439/330 |
| 4,080,032 A | * | 3/1978 | Cherian et al. | ............. 439/268 |
| 4,542,949 A | * | 9/1985 | Tewes et al. | ................. 439/70 |
| 4,616,895 A | * | 10/1986 | Yoshizaki et al. | .......... 439/330 |
| 5,066,245 A | * | 11/1991 | Walker | ........................ 439/526 |
| 5,493,237 A | * | 2/1996 | Volz et al. | ................... 324/754 |
| 5,788,510 A | * | 8/1998 | Walker | ........................ 436/61 |

* cited by examiner

Primary Examiner—Truc Nguyen
(74) Attorney, Agent, or Firm—Wei Te Chung

(57) ABSTRACT

An electrical connector (1) for connecting a land grid array (LGA) chip with a printed circuit board (PCB) includes a housing (10), and terminals (110) received in passageways (101) of the housing. The housing has a base (100) and sidewalls (102, 104), the base and the sidewalls cooperatively defining a space therebetween for retaining the LGA chip. Two sidewalls each define recesses (1021), thereby forming projections (1020). When terminals are installed near the projections, a carrier strip (11) connecting the terminals is bent so that connecting sections (111) of the carrier strip are received in corresponding recesses. The connecting sections are cut off, and the carrier strip is removed. The recesses enable the carrier strip to be manipulated so that sufficient space is made available for cutting off of the connecting sections without interfering with the sidewall. The projections provide precise fitting positioning of the LGA chip in the space.

10 Claims, 5 Drawing Sheets

ELECTRICAL CONNECTOR WITH DUAL-FUNCTION SIDEWALLS

CROSS REFERENCE TO RELATED APPLICATION

This application is a continuation of U.S. patent application Ser. No. 10/318,593, filed on Dec. 13, 2002, now U.S. Pat. No. 6,695,625, entitled "ELECTRICAL CONNECTOR WITH DUAL-FUNCTION SIDEWALLS," and invented by the same inventors.

BACKGROUND OF THE INVENTION

1. Field of the Invention

The present invention relates to an electrical connector for electrically connecting an electronic package such as a land grid array (LGA) chip with a circuit substrate such as a printed circuit board (PCB), and particularly to a connector having sidewalls that securely position the electronic package therebetween and that facilitate installation of terminals into the connector.

2. Description of the Prior Art

Land grid array (LGA) electrical connectors are widely used in the connector industry for electrically connecting LGA chips to printed circuit boards (PCBs) in personal computers (PCs). As described in "Nonlinear Analysis Helps Design LGA Connectors" (Connector Specifier, February 2001, pp. 18–20), the LGA connector mainly comprises an insulative housing and a multiplicity of terminals. The housing comprises a multiplicity of terminal passageways defined therein in a generally rectangular array for interferentially receiving corresponding terminals. Due to the very high density of the terminal array in a typical LGA chip, the LGA chip need to be precisely seated on the LGA connector to ensure reliable signal transmission between the terminals and the LGA chip. Means for accurately attaching the LGA chip to the LGA connector are disclosed in U.S. Pat. Nos. 4,504,105, 4,621,884, 4,692,790, 5,302,853 and 5,344,334.

Referring to FIG. 4, a conventional connector 6 comprises an insulative housing 60 and a multiplicity of terminals 61 received therein. In forming the connector 6, a carrier strip (not shown) comprises a row of the terminals 61, and a row of connecting sections 610 respectively connecting the terminals 61 with a main body of the carrier strip. The housing 60 comprises four raised sidewalls 62, and a flat base 63 disposed between the four raised sidewalls 62. The base 63 and the sidewalls 62 cooperatively define a space therebetween for receiving an LGA chip (not shown) therein. The base 63 defines a multiplicity of terminal passageways 64 for receiving the terminals 61 therein. When the LGA chip is seated on the LGA connector 6, the four sidewalls 62 can securely engage the LGA chip therebetween. However, installation of terminals 61 into those passageways 64 near the sidewalls 62 is problematic. Once the terminals 61 have been inserted into such passageways 64, the connecting sections 610 must be cut from their corresponding terminals 61. Because the carrier strip is located close to the sidewall 62, there is insufficient space to manipulate the carrier strip to allow easy cutting off of the connecting sections 610. Such manipulation is blocked by the sidewall 62, which is liable to sustain damage as a result.

FIG. 5 shows another conventional LGA connector 6' devised to overcome the above-described problem. The LGA connector 6' comprises a housing 60'. The housing 60' comprises a flat base 63' and four raised sides 62' surrounding the base 63'. Two opposite of the sides 62' each have a sloped surface that slants down toward the base 63'. The sloped surfaces provide additional space to manipulate a carrier strip to allow easy cutting off of connecting sections 610' from their corresponding terminals 61'. However, the sloped surfaces diminish the original advantage of the sides 62' being raised. That is, a reduced surface area of the sides 62' is available to retain the LGA chip therebetween. This can adversely affect the reliability of signal transmission between the terminals 61' and the LGA chip.

Therefore, a new LGA electrical connector which overcomes the above-mentioned problems is desired.

SUMMARY OF THE INVENTION

An object of the present invention is to provide an electrical connector for electrically connecting an electronic package such as an LGA chip with a circuit substrate such as a PCB, whereby the electrical connector can facilitate installation of terminals into a housing thereof.

Another object of the present invention is to provide an electrical connector having sidewalls that securely position an electronic package therebetween and that facilitate installation of terminals into the connector.

To achieve the above objects, an electrical connector in accordance with a preferred embodiment of the present invention is for connecting a land grid array (LGA) chip with a printed circuit board (PCB). The connector includes an insulative housing, and a plurality of terminals received in a plurality of passageways defined in the housing. The housing has a flat base and sidewalls extending upwardly from the base, the base and the sidewalls cooperatively defining a space therebetween for retaining the LGA chip therein. Two opposite of the sidewalls each define a multiplicity of evenly spaced recesses therein, thereby forming a multiplicity of evenly spaced projections.

When terminals are installed near the projections, a common carrier strip connecting the terminals is bent down so that connecting sections of the carrier strip are received in corresponding recesses. Junction portions between the terminals and their respective connecting sections are cut, and a main body of the carrier strip having the connecting sections is removed. The recesses enable the carrier strip to be manipulated so that sufficient space is made available for cutting off of the connecting sections without interfering with the sidewall thereat. The projections provide precise fitting positioning of the LGA chip in the space. This ensures that engagement between the terminals and pins of the LGA chip is accurate and reliable.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
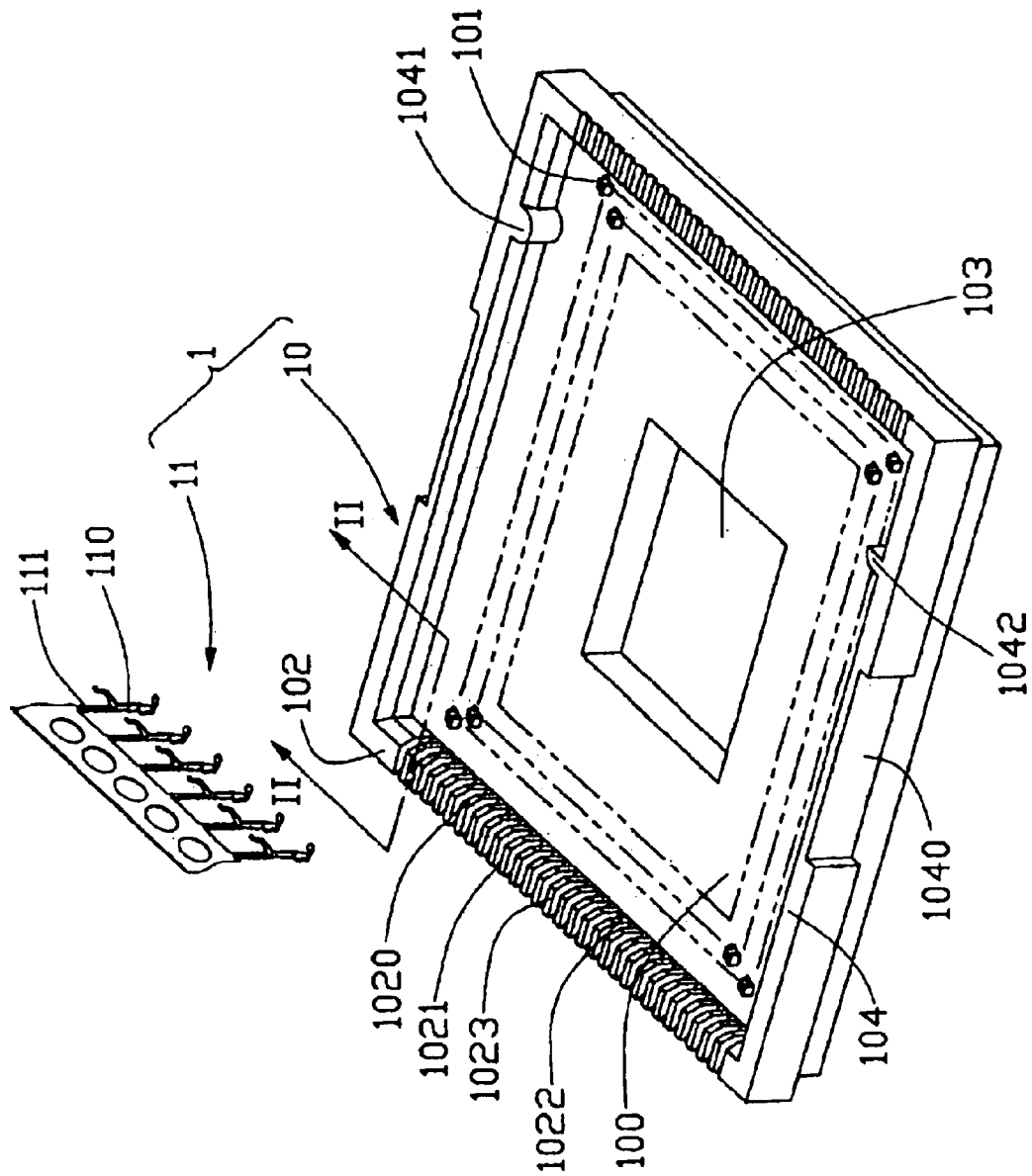
FIG. 1 is a simplified, exploded isometric view of an LGA electrical connector in accordance with a preferred embodiment of the present invention.
Figure 2:
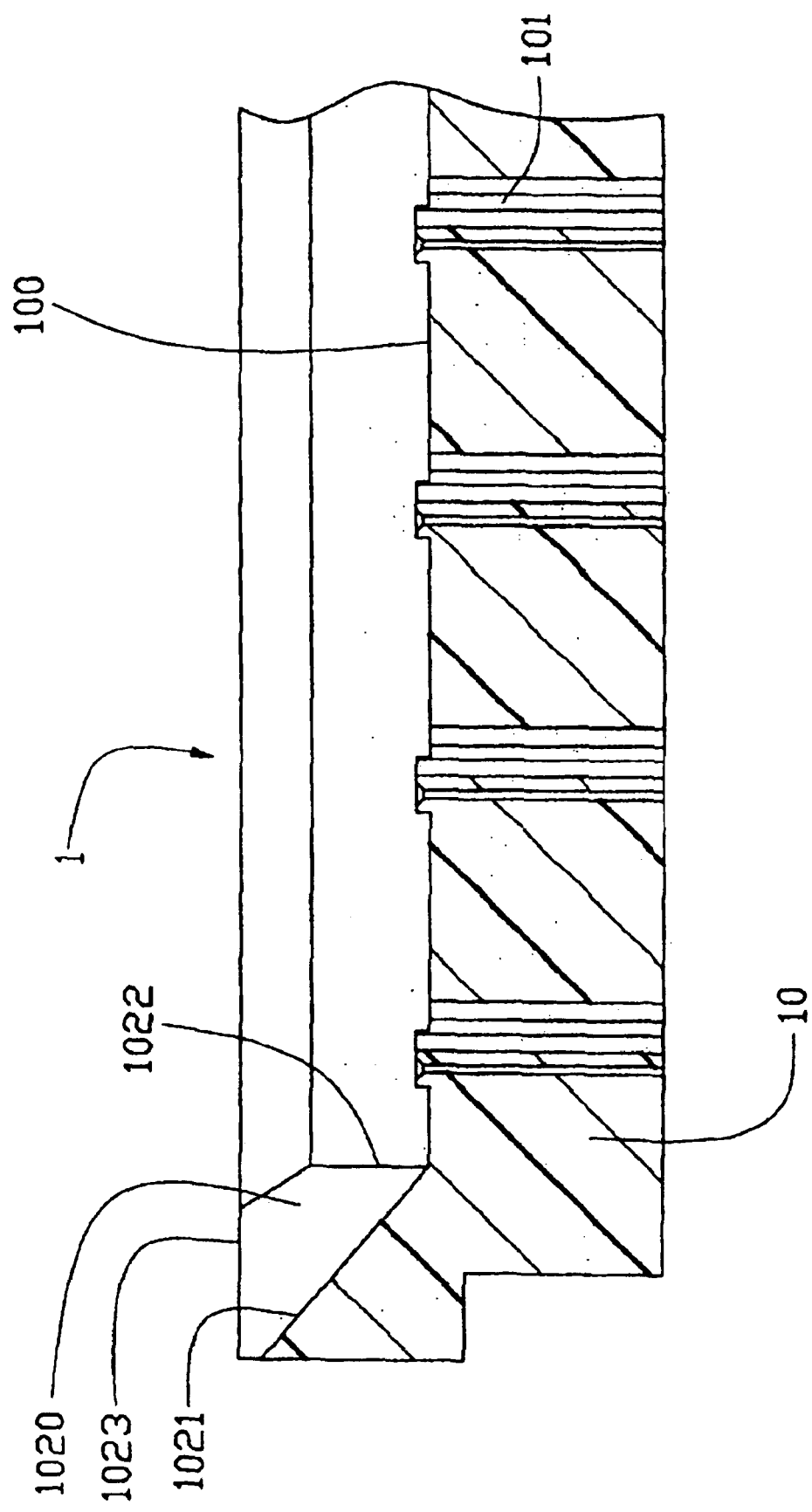
FIG. 2 is a cross-sectional view taken along line II—II of FIG. 1.

Referring to FIGS. 1 and 2, an LGA electrical connector 1 in accordance with a preferred embodiment of the present invention comprises an insulative housing 10 and a multiplicity of terminals 110. In forming the LGA connector 1, an exemplary carrier strip 11 comprises a row of the terminals 110, and a row of connecting sections 111 respectively connecting the terminals 110 with a main body of the carrier strip.

The housing 10 is substantially rectangular. The housing 10 comprises two opposite first sidewalls 102, two opposite second sidewalls 104 interconnecting the first sidewalls 102, and a flat base 100 disposed between the first and second sidewalls 102, 104. The base 100 and first and second sidewalls 102, 104 cooperatively define a space therebetween for receiving an LGA chip (not shown) therein. The base 100 defines a square central cavity 103 therein, and a multiplicity of terminal passageways 101 regularly arranged in a generally rectangular array for interferentially receiving corresponding terminals 110 therein. The first sidewalls 102 each define a multiplicity of evenly spaced recesses 1021 therein, thereby forming a multiplicity of evenly spaced projections 1020. Each recess 1021 is bounded at a bottom thereof by a sloped surface of the first sidewall 102, such that an inner portion of the recess 1021 is disposed lower than an outer portion thereof. Accordingly, a side elevation cross section of each projection 1020 is trapezium-shaped. The projection 1020 comprises an inmost vertical first surface 1022, a top second surface 1023, and a chamfered surface between the first surface 1022 and the second surface 1023. Cutouts 1040 are defined in respective outer faces of the second sidewalls 104, for engagingly receiving a pick-up cover (not shown) that enables the LGA connector 1 to be transferred and mounted on a printed circuit board (not shown). A first protrusion 1041 and a second protrusion 1042 are respectively formed on opposite inner faces of the second sidewalls 104. The LGA chip can be guidably fixed between the first and second protrusions 1041, 1042 and the first surfaces 1022 of the first sidewalls 102.

In assembly of the LGA connector 1, firstly the housing 10 is molded. The carrier strip 11 is positioned above the base 100 of the housing 10, parallel and close to the first surfaces 1022 of the projections 102 of one first sidewall 102. The carrier strip 11 is moved downwardly, so that the terminals 110 are received into corresponding terminal passageways 101 of the housing 10. The connecting sections 111 of the carrier strip 11 are located above the passageways 101, parallel to the first surfaces 1022 of the projections 102 and opposite corresponding recesses 1021 of the first sidewall 102. The carrier strip 11 is bent down toward the first sidewall 102, so that the connecting sections 111 of the carrier strip 11 are received in the corresponding recesses 1021. Junction portions between the terminals 110 and their respective connecting sections 111 are cut, and the main body of the carrier strip 11 having the connecting sections 111 is removed. The above procedure is repeated as necessary for one or more other carrier strips 11 at either or both of the first sidewalls 102. Thus, assembly of the LGA connector 1 is completed. The recesses 1021 enable the carrier strip 11 to be manipulated so that sufficient space is made available for cutting off of the connecting sections 111 without interfering with the first sidewall 102.

The LGA chip (not shown) is then pushed onto the base 1001 of the housing 10. Pins of the LGA chip are engaged with the terminals 110, thus connecting the LGA chip with the connector 1. The projections 1020 of the first sidewalls 102 and the first and second protrusions 1041, 1042 of the second sidewalls 104 cooperate to precisely fittingly position the LGA chip therebetween. This ensures that the engagement between the terminals 110 and pins of the LGA chip is accurate and reliable.

Figure 3:
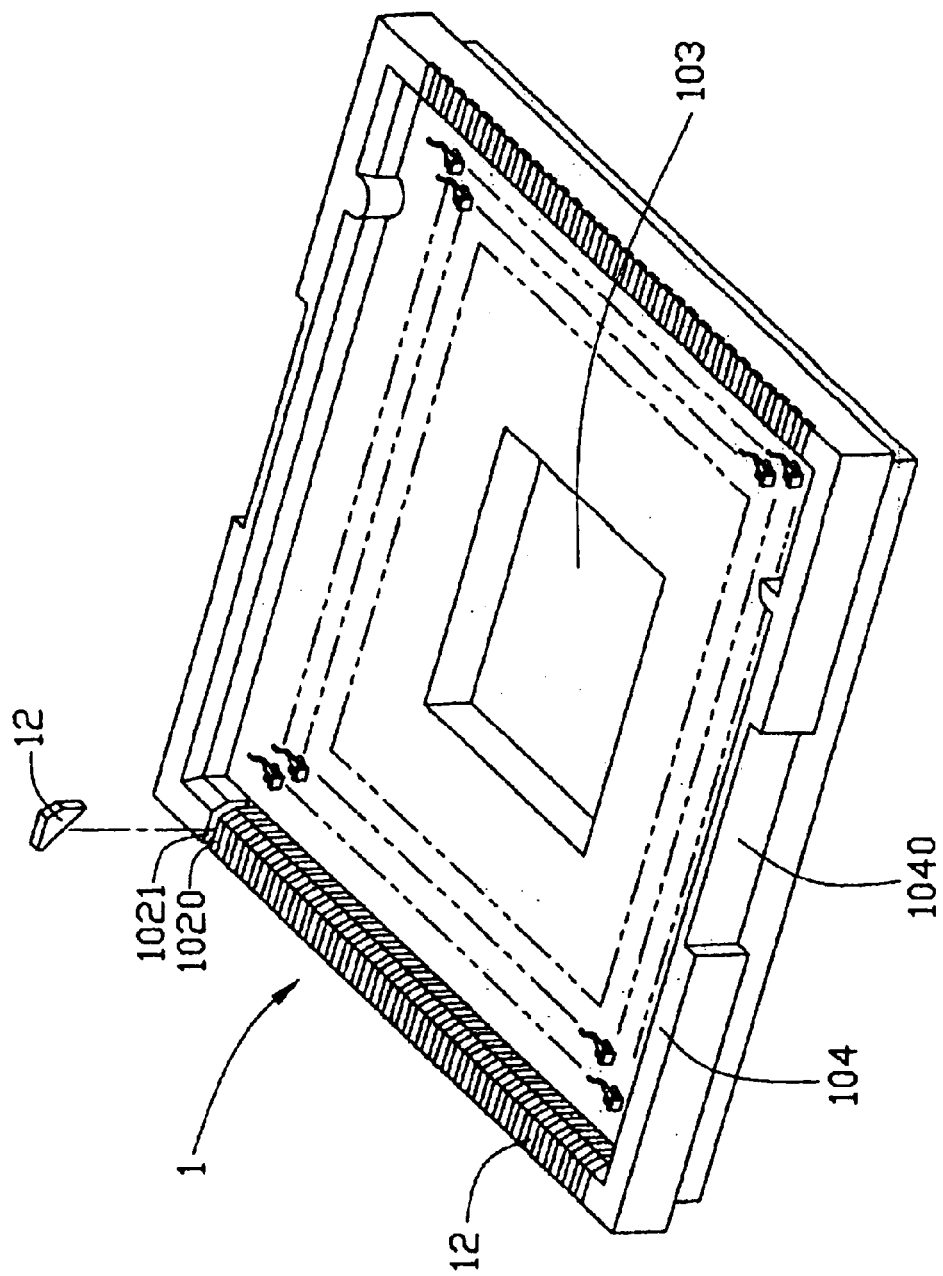
FIG. 3 is essentially an assembled view of FIG. 1, together with a complementary block ready for insertion into one of recesses of the connector.
Figure 4:
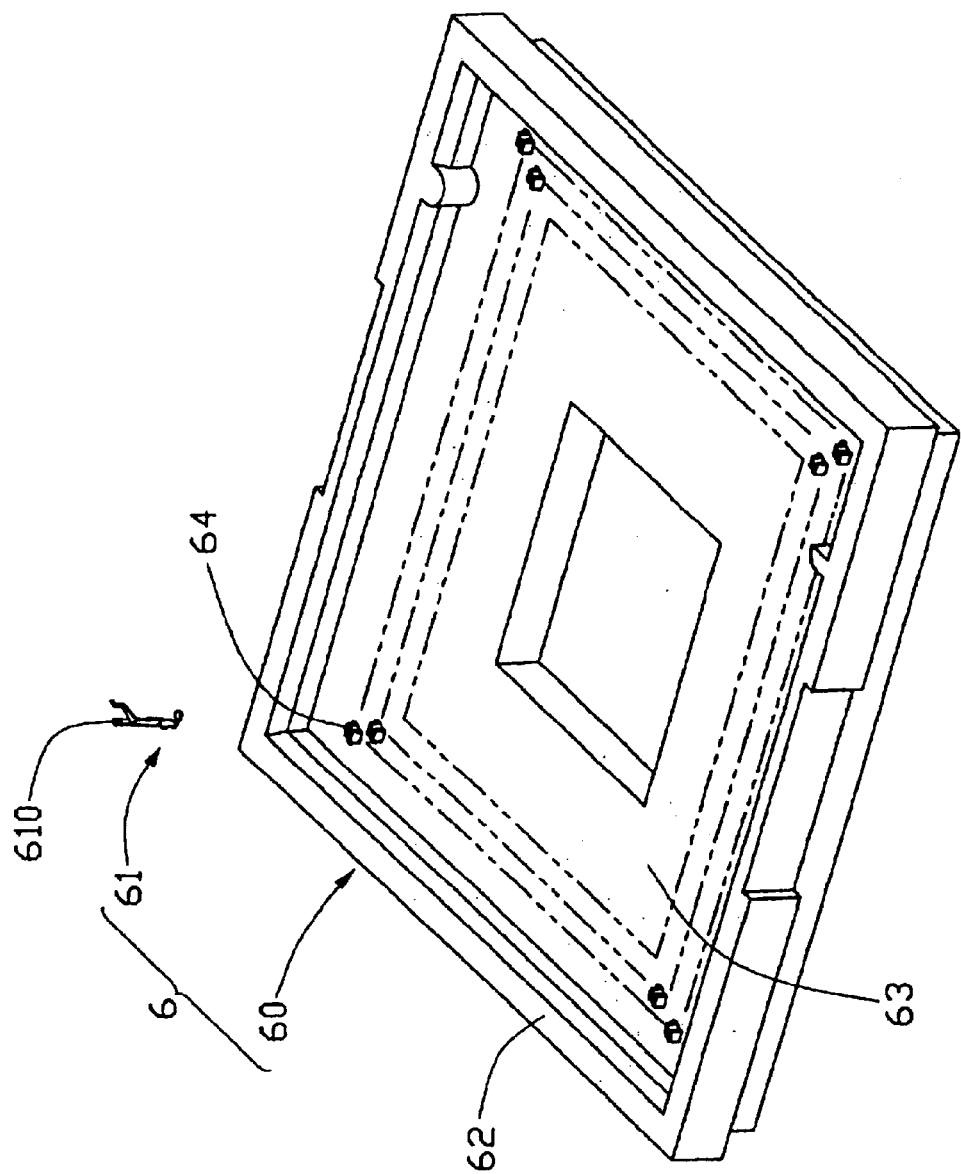
FIG. 4 is a simplified, exploded isometric view of a conventional LGA electrical connector.
Figure 5:
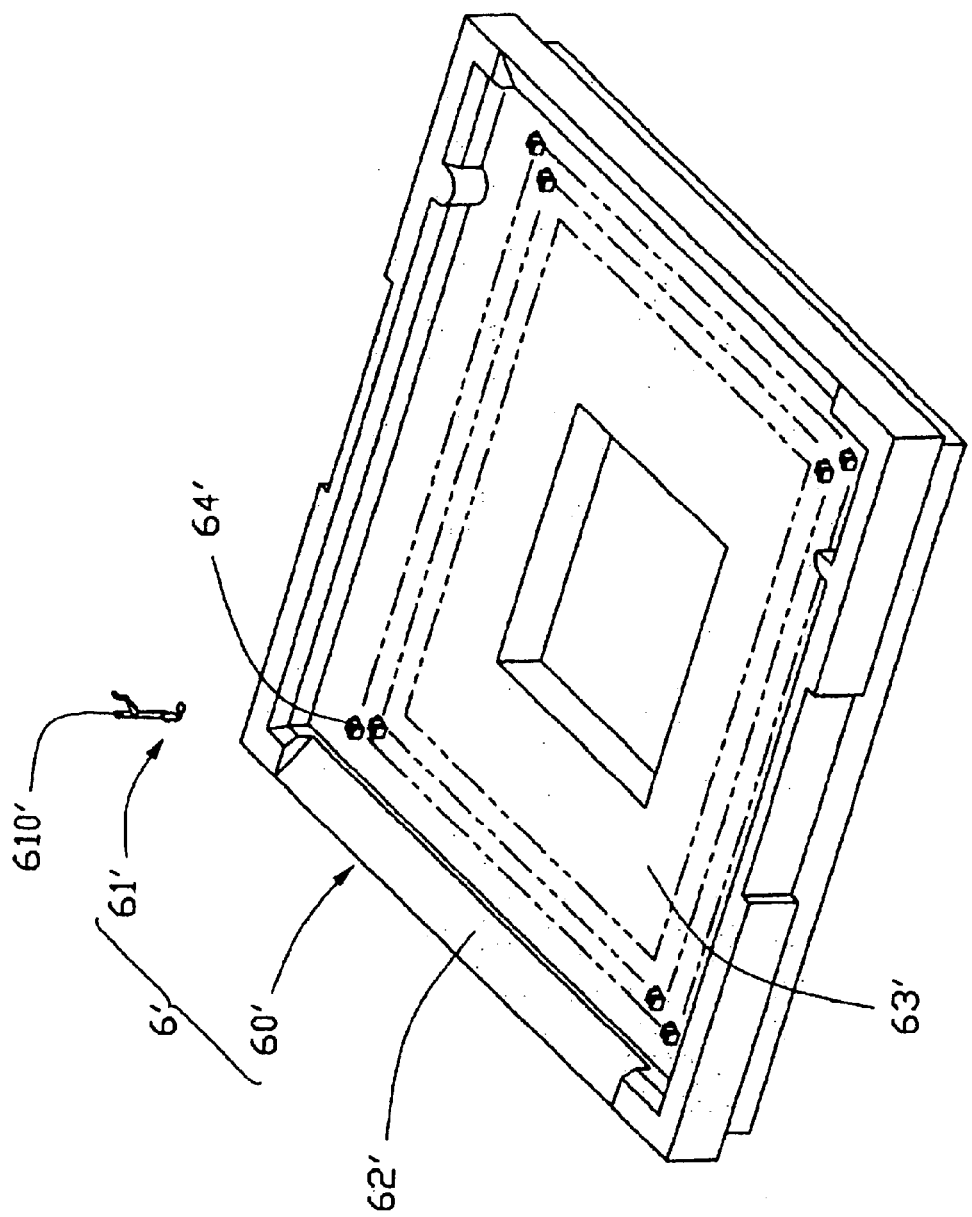
FIG. 5 is a simplified, exploded isometric view of another conventional LGA electrical connector.

Referring to FIG. 3, a plurality of complementary blocks 12 is provided for fittingly engaging in the recesses 1021 of the first sidewalls 102 respectively. In the preferred embodiment of the present invention, a configuration and size of each block 12 is similar to a configuration and size of each projection 1020. When each block 12 is engaged in its corresponding recess 1021, a flat face of the block 12 is coplanar with the first surfaces 1022 of the adjacent projections 1020 of the first sidewall 102. Thus the first sidewalls 102 in cooperation with the blocks 12 provide more contact surface area for enhanced retention of the LGA chip therebetween.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package, comprising:

an insulative housing having a base and sidewalls extending upwardly from the base to define a space thereof for receiving the package, a plurality of passageways being arrayed in the base each receiving a conductive terminal therein; and at least one of the sidewalls has a plurality of recesses formed therein, each recess has an sloped bottom surface, a top opening extending upwardly opposite to the bottom surface and a side opening connecting with the top opening toward the space and in alignment with an array of the passageways, the top opening and the side opening cooperatively facilitate installation of the terminals into the passageways a plurality of blocks for fittingly engaging in the recesses of the at least one sidewall respectively after installation of the terminals into the passageways; and wherein a configuration of each of the blocks is similar to that of each of the projections.

2. The electrical connector of claim 1, wherein the sloped bottom surface of the recess comprises a higher outer portion and a lower inner portion.

3. The electrical connector of claim 2, wherein a plurality of projections is formed between every two adjacent recesses, each projection comprises a first inner surface for abutting the package, a second top surface, and a chamfered surface between the first surface and the second surface.

4. An electrical connector assembly, comprising:

a plurality of carrier strips each comprising a row of conductive terminals and a row of connecting sections respectively connecting the terminals with a main body of the carrier strip;

an insulative housing having a plurality of passageways arrayed therein for receiving corresponding terminals, the housing comprising a plurality of sidewalls, at least one of the sidewalls defining a plurality of recesses and a plurality of projections alternately located between every two adjacent recesses;

wherein each of said recesses has a sloped bottom surface and an indented surface facing the corresponding nearest passageway and in alignment with a corresponding one of said terminals on the carrier strip, which is inserted into said corresponding nearest passageway, to receive therein the connecting section connected between said corresponding terminal and the carrier strip for facilitating installation of the corresponding terminal into the corresponding passageway of the housing; and wherein said recess receives no portion of the corresponding terminal while the corresponding passageway receives a major portion of the corresponding terminal under a condition that a top portion of the corresponding terminal extends upwardly above the flat base.

5. The electrical connector assembly of claim 4, wherein said recess and the corresponding nearest passageway are not vertically aligned with, but offset from each other.

6. The electrical connector assembly of claim 4, wherein said passageways are located in a flat base of said housing surrounded by said side walls.

7. The electrical connector assembly of claim 4, wherein said projections of the side walls commonly define a space so as to precisely fittingly positioning an LGA chip therein.

8. The electrical connector assembly of claim 4, wherein each of the projections comprises an inner first surface for abutting an electronic package, a top second surface, and a chamfered surface between the first surface and the second surface.

9. The electrical connector assembly of claim 8, wherein the connector assembly further comprising a plurality of blocks for fittingly engaging in the recesses of the at least one sidewall respectively after the main body of the carrier strip being removed.

10. The electrical connector assembly of claim 9, wherein a configuration of each of the blocks is similar to a configuration of each of the projections.

* * * * *